(12) United States Patent
Savoj

(10) Patent No.: US 7,239,208 B1
(45) Date of Patent: Jul. 3, 2007

(54) DEVICE AND METHOD FOR FREQUENCY SYNTHESIS FOR WIRELINE TRANSCEIVERS AND SIMILAR DEVICES

(75) Inventor: Jafar Savoj, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 62 days.

(21) Appl. No.: 11/159,178

(22) Filed: Jun. 23, 2005

Related U.S. Application Data

(60) Provisional application No. 60/645,882, filed on Jan. 19, 2005.

(51) Int. Cl.
*H03L 7/08* (2006.01)

(52) U.S. Cl. ............ 331/16; 331/25; 327/117; 327/156; 455/260

(58) Field of Classification Search .......... 331/1 A, 331/16, 18, 25, 34; 327/115, 117–118, 156–159; 455/260, 313, 323, 333
See application file for complete search history.

(56) References Cited

U.S. PATENT DOCUMENTS

2005/0104634 A1 * 5/2005 Fujishima ............... 327/117

OTHER PUBLICATIONS

U.S. Appl. No. 11/167,173 Specification containing 27 pages and 3 sheets of drawings (Figures 1,2,3 and 4); Inventor Jafar Savoj.

* cited by examiner

*Primary Examiner*—David Mis

(57) ABSTRACT

A circuit, system, and method of generating multiple frequencies from a reduced number of input oscillation frequency signals including an input that receives at least two input oscillation frequency signals, each having a different phase. The circuit includes a combiner that combines that input oscillation frequency signals and at least one calculated signal and outputs a first output oscillation frequency signal having a different frequency than each of the at least two input oscillation frequency signals. The circuit further includes a calculator circuit, responsive to the first output oscillation frequency signal, that outputs the at least one calculated signal.

39 Claims, 8 Drawing Sheets

DEVICE AND METHOD FOR FREQUENCY SYNTHESIS FOR WIRELINE TRANSCEIVERS AND SIMILAR DEVICES

CROSS-REFERENCE TO RELATED APPLICATIONS

This application claims priority under 35 U.S.C. §119(e) of provisional U.S. Patent Application No. 60/645,882, filed on Jan. 19, 2005, the disclosure of which is expressly incorporated by reference herein in its entirety.

BACKGROUND OF THE INVENTION

1. Field of the Invention

The invention is directed generally to multiple frequency synthesis for wire-line transceivers and similar devices and, more particularly, to multiple frequency synthesis for wire-line transceivers and similar devices using fewer clock sources than the number of frequencies needed.

2. Related Art

Many devices, such as wire line transceivers, may be required to operate in conjunction with multiple operating frequencies or have a requirement for a source of multiple operating frequencies.

Some of these frequencies may be derived by applying coding schemes to the data. However, some of these frequencies may not be able to be synthesized using such techniques. The result is that in order to synthesize a number of frequencies, a similar number of clock sources, such as phase lock loop devices, must be employed in a system. This can result in increases in complexity, cost, and/or chip/circuit size.

More specifically, many network standards, such as Ethernet standards, require at least two different types of encoding of serial data. There are numerous reasons for encoding serial data. For example, data may be encoded to transform an original sequence of data into another stream that is DC balanced. Additionally, encoding the data that is transmitted in a network may facilitate having a minimum number of transitions in each data block. Moreover, encoding may be beneficial in that it allows for implementation of systems having an AC-coupled configuration. Furthermore, this may ease the tasks of clock and data recovery by providing sufficient transitions to facilitate phase blocking.

For example, one such exemplary encoding scheme is a 64 bit–66 bit (64 B/66 B) encoding scheme. The 64 B/66 B encoding scheme includes two redundancy bits that are added to a sequence of data that is 64 bits in length. When the 64 B/66 B encoding scheme is applied to a 10 Gb/s data signal, the result is an effective output rate of 10.3125 Gb/s. Another scheme for encoding data is 8 bit–10 bit (8 B/10 B) encoding scheme in which two bits are added in a sequence of 8 bits. Applying 8 B/10 B encoding scheme to a sequence of data that is operating at 2.5 Gb/s results in an effective output rate of 3.125 Gb/s. However, the requirement for multiple frequencies in turn has resulted in a requirement for multiple clock sources that results in increased complexity, cost and chip/circuit size.

Accordingly, there is a need for a device or source of multiple frequencies in communication devices such as wireline transceivers that provides a cost savings, chip size reduction and/or reduction in complexity.

SUMMARY OF THE INVENTION

The invention meets the foregoing need and allows robust generation of multiple operating frequencies using a single or reduced number of clocks that results in a significant area reduction in the device.

According to one aspect of the invention a circuit includes an input that receives at least two input oscillation frequency signals, each having a different phase, a combiner circuit that combines the input oscillation frequency signals and at least one calculated signal and outputs a first output oscillation frequency signal having a different frequency than each of the at least two input oscillation frequency signals, and a calculator circuit, responsive to the first output oscillation frequency signal, that outputs the at least one calculated signal. A phase locked loop device may include the circuit noted above. One of an Ethernet controller, transceiver and a computer motherboard may synthesize frequencies with the circuit noted above. The circuit further may include a clock generator, such as a quadrature oscillator, to output the at least two input oscillation frequency signals to the input. The combiner circuit may include at least two mixers responsive to at least one of the at least two input oscillation frequency signals and the at least one calculated signal. The combiner circuit further may include a summer that receives an output from each of the at least two mixers and that outputs the first output oscillation frequency to the calculator circuit. The calculator circuit may include a divide by N circuit. The at least one calculated signal may include two output signals that may be output from the divide by N circuit and may be respectively received by at least two mixers, wherein N may represent a positive integer. The two output signals may include a quadrature output and an in-phase output. The divide by N circuit may divide the first output oscillation frequency signal to form the two output signals. The divide by N circuit may include one of a divide by four (4) circuit and a divide by thirty-two (32) circuit. The first output oscillation frequency may be $f_{out}$, and the input oscillation frequency signals may be $\cos(2\pi f_{in} t)$ and $\sin(2\pi f_{in} t)$ and $f_{in}$ and $f_{out}$ may be described by $\cos(2\pi f_{out} t) = \cos(2\pi f_{in} t)\cos(2\pi (f_{out}/N)t) + \sin(2\pi f_{in} t)\sin(2\pi (f_{out}/N)t)$. The at least two input oscillation frequency signals may have a quadrature frequency of 3.125 GHz and the first output oscillation frequency signal may have a frequency of 2.5 GHz. Alternatively, the at least two input oscillation frequency signals may have a quadrature frequency of 10.3125 GHz and the first output oscillation frequency signal may have a frequency of 10 GHz. Of course, other frequencies may also be used, as the skilled artisan will recognize. The calculator circuit may include divide by $N_i$ circuits serially arranged. A final one of the divide by $N_i$ circuits may have two outputs that may be respectively received by at least two mixers and an output of at least one of the divide by $N_i$ circuits may include an intermediate output oscillation frequency signal. The calculator circuit further may include a first additional mixer receiving outputs from at least two of the divide by $N_i$ circuits, a second additional mixer receiving outputs from the at least two of the divide by $N_i$ circuits, and a subtractor that receives outputs from the first additional mixer and the second additional mixer and that outputs a second oscillation frequency. N may represent any positive integer. The combiner circuit may include at least two mixers responsive to at least one of the at least two input oscillation frequency signals and the at least one calculated signal, and a summer, responsive to the at least two mixers, that outputs the first output oscillation frequency to the calculator circuit, the at least one calculated signal may include a quadrature output and an in-phase output received by the at least two mixers, and the calculator circuit may include a divide by N circuit, wherein N represents a positive integer, the divide by N circuit dividing the first output oscillation frequency signal to form the quadrature output and in-phase output. The phase locked loop discussed above may include a phase frequency detector that receives at least one reference input, a charge pump that receives an output from the phase frequency detector, a loop filter that may receive an output from the charge pump, and an oscillator that receives an output from the loop filter and the circuit receives an output from the oscillator.

According to a further aspect of the invention a method of generating multiple rates includes receiving at least two input oscillation frequency signals, each having a different phase, combining the at least two input oscillation frequency signals and at least one calculated signal and outputting a first output oscillation frequency signal having a different frequency than each of the at least two oscillation frequency signals, and calculating the at least one calculated signal in response to the first output oscillation frequency signal. One of an Ethernet controller, transceiver and a computer motherboard may synthesize frequencies according to the above noted method. The method may include generating the at least two input oscillation frequency signals. The combining step may include mixing each of the input oscillation frequency signals with the at least one calculated signal to create two mixed outputs. The method may include summing the mixed outputs together to output the first output oscillation frequency. The calculating step further may include dividing the first output oscillation frequency by N. The at least one calculated signal may include two output signals that are divided in the dividing step and mixed with the input oscillation frequency signals, wherein N in the dividing step represents a positive integer. The two output signals may include a quadrature output and an in-phase output. The step of dividing may divide the first output oscillation frequency signal to form the two output signals. The first output oscillation frequency is $f_{out}$, and the input oscillation frequency signals may be $\cos(2\pi f_{in}t)$ and $\sin(2\pi f_{in}t)$ and $f_{in}$ and $f_{out}$ may be described by $\cos(2\pi f_{out}t) = \cos(2\pi f_{in}t)\cos(2\pi(f_{out}/N)t) + \sin(2\pi f_{in}t)\sin(2\pi(f_{out}/N)t)$. The at least two input oscillation frequency signals may have a quadrature frequency of 3.125 GHz and the first output oscillation frequency signal may have a frequency of 2.5 GHz. Alternatively, the at least two input oscillation frequency signals may have a quadrature frequency of 10.3125 GHz and the first output oscillation frequency signal may have a frequency of 10 GHz. Of course, other frequencies may also be used, as the skilled artisan will recognize. The method may include repeatedly dividing the first input oscillation frequency by $N_i$ in serial fashion to form a plurality of divided signals, with each divided signal being reduced by further division until the final division occurs, the output of the final division comprising two outputs forming the at least one calculated signal. The method may include mixing two of the plurality of divided signals to form a first mixed signal, mixing another two of the plurality of divided signals to form a second mixed signal, and subtracting the first mixed signal and the second mixed signal to form a second output oscillation frequency signal. $N_i$ in the repeatedly dividing step may be any positive integer. The calculating step further may include dividing the first output oscillation frequency by N, the at least one calculated signal may include two output signals that are divided in the dividing step and mixed with the input oscillation frequency signals, wherein N in the dividing step represents a positive integer and the two output signals may include a quadrature output and an in-phase output.

According to yet another aspect of the invention a circuit includes means for inputting at least two input oscillation frequency signals, each having a different phase, means for combining the input oscillation frequency signals and at least one calculated signal and for outputting a first output oscillation frequency signal having a different frequency than each of the at least two input oscillation frequency signals, and means for calculating, responsive to the first output oscillation frequency signal, the at least one calculated signal. A phase locked loop device may include the above-noted circuit. One of an Ethernet controller, transceiver and a computer motherboard may synthesize frequencies with the above-noted circuit. The circuit further may include means for outputting the at least two input oscillation frequencies which may include a quadrature oscillator. The means for combining may include at least two means for mixing responsive to at least one of the at least two oscillation frequency signals and the at least one calculated signal. The means for combining further may include means for summing that receives an output from the means for mixing and that outputs the first output oscillation frequency to the means for calculating. The means for calculating further may include means for dividing by N. The at least one calculated signal may include two output signals that may be output from the means for dividing by N and may be respectively received by the at least two means for mixing, wherein N may represent a positive integer. The two output signals may include a quadrature output and an in-phase output. The means for dividing by N may divide the first output oscillation frequency signal to form the two output signals. The means for dividing by N may include one of a divide by four (4) circuit and a divide by thirty-two (32) circuit. The first output oscillation frequency may be $f_{out}$, and the input oscillation frequency signals may be $\cos(2\pi f_{in}t)$ and $\sin(2\pi f_{in}t)$ and $f_{in}$ and $f_{out}$ may be described by $\cos(2\pi f_{out}t) = \cos(2\pi f_{in}t)\cos(2\pi(f_{out}/N)t) + \sin(2\pi f_{in}t)\sin(2\pi(f_{out}/N)t)$. The at least two input oscillation frequency signals may have a quadrature frequency of 3.125 GHz and the first output oscillation frequency signal may have a frequency of 2.5 GHz. Alternatively the at least two input oscillation frequency signals may have a quadrature frequency of 10.3125 GHz and the first oscillation output frequency signal may have a frequency of 10 GHz. Of course, other frequencies may also be used, as the skilled artisan will recognize. The means for calculating may include a plurality of means for dividing by $N_i$ arranged serially, a final one of the means for dividing by $N_i$ may have two outputs that may be respectively received by the at least two means for mixing and wherein an output of at least one of the means for dividing by $N_i$ may include an intermediate output oscillation frequency signal. The means for calculating further may include a first additional means for mixing that receives outputs from at least two of the means for dividing by Ni, a second additional means for mixing that receives outputs from at least two of the means for dividing by Ni, and means for subtracting that receives inputs from the first additional means for mixing and the second additional means for mixing and that outputs a difference to form a second output oscillation frequency signal. N may represent any positive integer. The phase locked loop device further may include means for frequency detecting that receives at least one reference input, means for charge pumping that receives an output from the means for frequency detecting, means for filtering that receives an output from the means for charge pumping, and means for oscillating that receives an output from the means for filtering and the circuit receives an output from the means for oscillating. The means for combining may include at least two means for mixing responsive to at least one of the at least two input oscillation frequency signals and the at least one calculated signal, and means for summing, responsive to the at least two means for mixing, that outputs the first output oscillation frequency to the means for calculating; the at least one calculated signal may include a quadrature output and an in-phase output received by the at least two means for mixing; and the means for calculating includes a means for dividing by N, wherein N represents a positive integer, the means for dividing by N divides the first output oscillation frequency signal to form the quadrature output and in-phase output.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and the various ways in which it may be practiced. In the drawings.

DETAILED DESCRIPTION OF THE INVENTION

Figure 1:
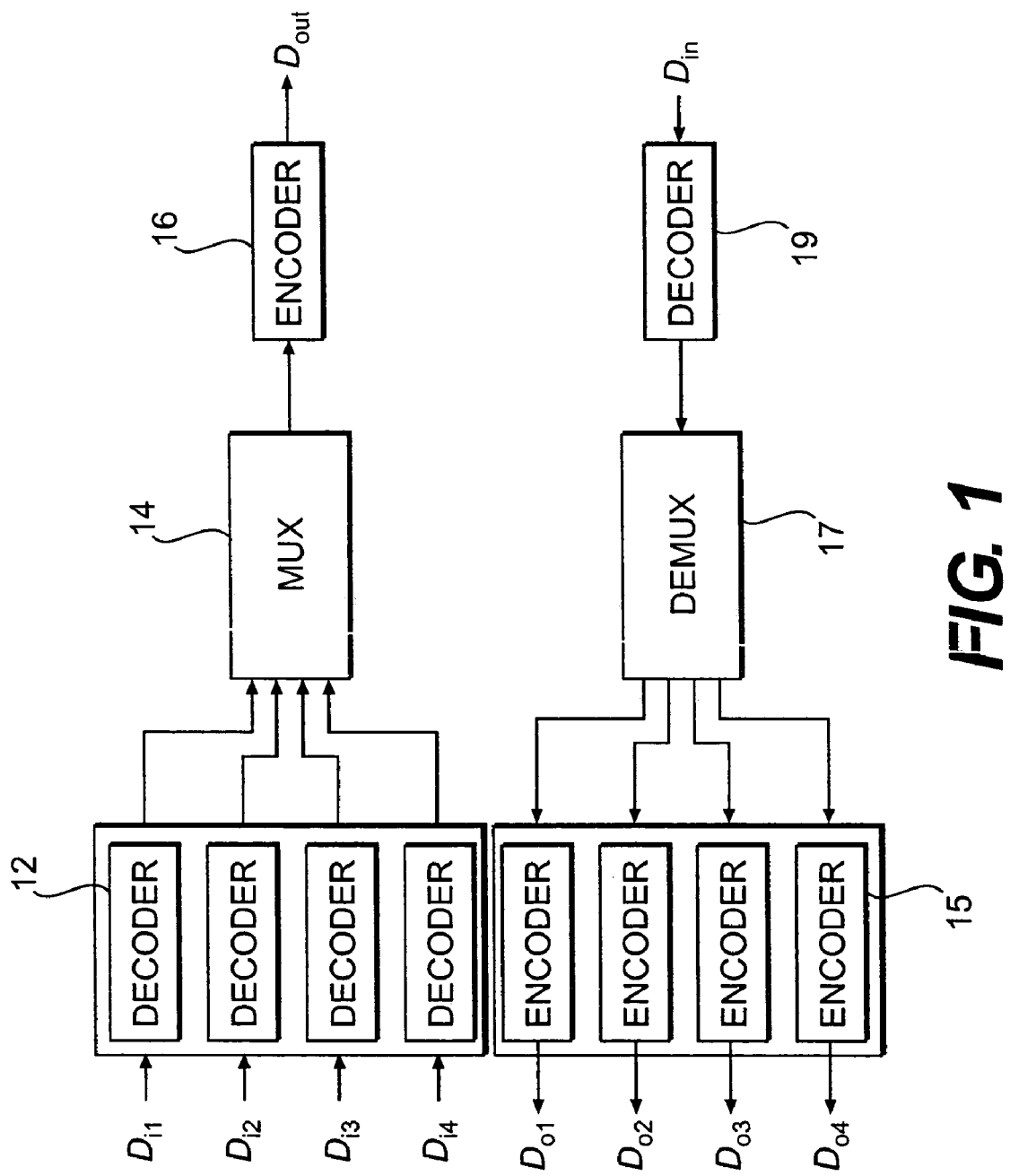
FIG. 1 shows an application of the invention in the form of a receiver and transmitter structure that requires multiple frequencies in which the invention may be employed.

The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals represent similar parts throughout the several views of the drawings.

FIG. 1 depicts a transmitter structure that can be a separate component or combined with other components in a transceiver system. The transmitter structure includes four input sequences $D_{i1}$, $D_{i2}$, $D_{i3}$, and $D_{i4}$. These input sequences are input into a decoder 12 (or a plurality of decoders) at a first frequency. The inputs $D_{i1}$, $D_{i2}$, $D_{i3}$, and $D_{i4}$ are decoded in the decoder 12 and the data is forwarded from the decoder 12 at a second frequency. Subsequently, the data that has been output from the decoder 12 is then merged in a multiplexer 14 into one stream operating at a third frequency. The data exiting the multiplexer 14 will then be encoded further by an encoder 16, such that the data $D_{out}$ is then transmitted at a fourth frequency.

FIG. 1 further shows a receiver structure that can be a separate component or combined with other components in a transceiver system. The receiver structure depicted in FIG. 1 operates in reverse to the transmitter structure. The data stream $D_{in}$ is received by the system as a sequence at the fourth frequency. This data stream is then decoded in a decoder 19. The data stream output from the decoder 19 operates at the third frequency. This data stream is then forwarded to a demultiplexer 17. The output of the demultiplexer 17 creates four data paths, each operating at the second frequency. Each of these four data paths are then input into an encoder 15 (or plurality of encoders) where the data is encoded to form data path $D_{o1}$, $D_{o2}$, $D_{o3}$, and $D_{o4}$. Each of the four data paths $D_{o1}$, $D_{o2}$, $D_{o3}$, and $D_{o4}$ operate at the first frequency. The receiver and transmitter structures can be separate components or may be combined to form a multiple function device such as a transceiver.

In an exemplary aspect of the system of FIG. 1, the first frequency may be 3.125 Gb/s, the second frequency may 2.5 Gb/s, the third frequency may be 10 Gb/s, and the fourth frequency may 10.3125 Gb/s. However, it is contemplated that the invention can be used with different frequencies for different protocols or future enhancements thereof. Moreover, a fewer or a greater number of frequencies can be generated in accordance with the principles of the invention for different protocols or future enhancements thereof.

When used in conjunction with the structure of FIG. 1, the invention may reduce and/or avoid the complexity and cost of designing multiple clock sources, such as phase-locked loop devices, to generate each of the multiple frequencies. Only a single (or fewer than the required frequencies) clock source and/or phase-locked loop systems may be required. Moreover, while the invention is described in a transceiver application, it may be used with any device, system, or application requiring multiple frequencies, including, for example, an Ethernet controller.

Figure 2:
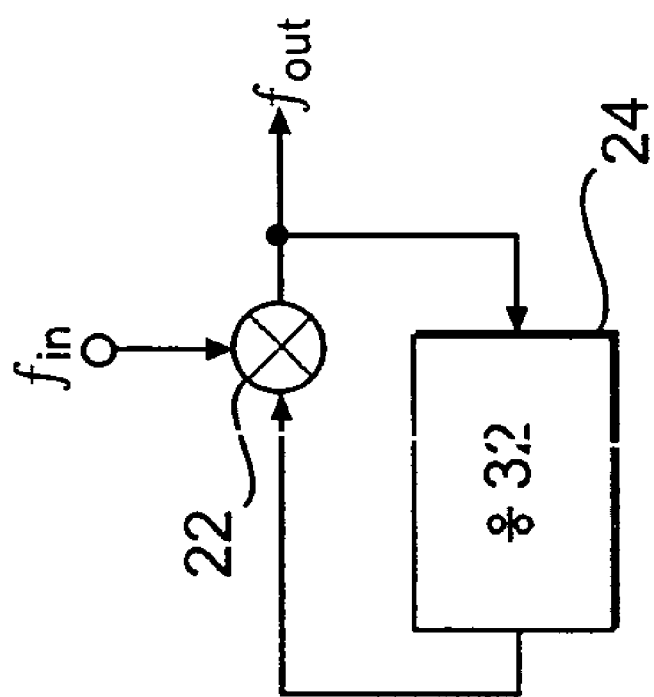
FIG. 2 shows a frequency divider constructed according to the principles of the invention.

FIG. 2 shows a frequency divider circuit that allows a single clock source and/or phase-locked loop device (not shown) to generate multiple frequencies and thus reduce complexity of the system and/or reduce chip area. In particular, a frequency divider 24, as shown in FIG. 2, is used in conjunction with a mixer 22. A first frequency signal $f_{in}$ is input to the mixer 22. An output $f_{out}$ of the mixer 22 is then input into a divide by N device 24 (where N is a positive integer such as a modulo 2 number (i.e. 2, 4, 8, 16, . . . n)), such as a divide by 32 device, which divides the signal $f_{out}$. The signal $f_{out}$ is then fed back to the mixer 22. The mixer 22 will output a difference of the $f_{out}$ and $f_{in}$ signals. The resultant frequency that is output from the mixer 22 can be described as:

$$f_{out} = f_{in} - f_{out}/N$$

In the particular aspect shown in FIG. 2, when N equals 32 then the resultant frequency output from the mixer 22 is described as:

$$f_{out} = f_{in} - f_{out}/32$$

However, during operation, the mixer 22 produces both a sum and a difference of the frequencies at its output $f_{out}$ such that:

$$f_{out} = f_{in} \pm f_{out}/N$$

and when N is, for example only, equal to 32 we have:

$$f_{out} = f_{in} \pm f_{out}/32$$

Accordingly, it is desirable to obtain either a sum frequency or a difference frequency and not to have both. One approach to removing one these frequencies is to provide a low pass filter or high pass filter within the feedback loop. However, when N is larger (e.g. N=32), then such an approach may have less than satisfactory results because a filter may not work well. More specifically, a larger N will result in closer frequencies and a filter may have poor performance in removing/blocking the unwanted frequency signal. Another approach that may be used where the two output frequencies are relatively close and cannot be separated by filtering is shown in FIG. 3 as noted below.

Figure 3:
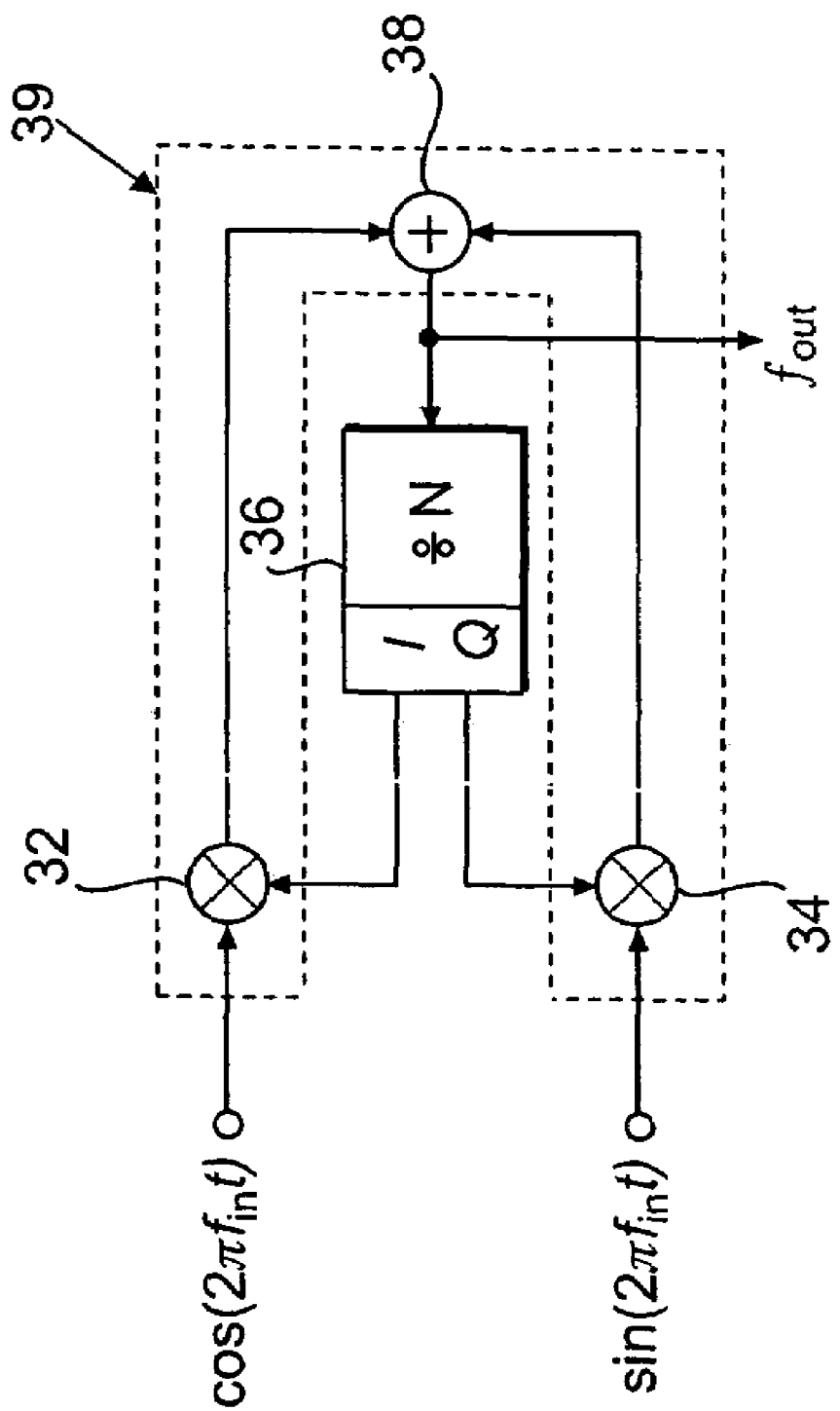
FIG. 3 shows a quadrature multiplier implementation of the circuit of FIG. 2.

FIG. 3 shows a quadrature multiplier that can be used in order to eliminate an unwanted sum frequency. In particular, the quadrature multiplier implementation shown in FIG. 3 includes two inputs of the $f_{in}$ signal. The two inputs may be produced from a quadrature oscillator, which is a known structure in the art for providing phase shifted clock signals. The first input from the quadrature oscillator directed to a mixer 32 is a $\cos(2\pi f_{in} t)$ signal. The second input from the quadrature oscillator directed to a second mixer 34 is a $\sin(2\pi f_{in} t)$ signal. The output of mixer 32 and mixer 34 are then summed by being input to a summer 38. The summer 38 will sum the signals and input this sum into the divide by N circuit 36. The divide by N circuit 36 will output "I" and "Q" outputs that will then be input into mixer 32 and mixer 34, respectively, together with the two $f_{in}$ signals noted above. The output of the summer 38 also will be tapped for the $f_{out}$ signal. The mixers and summer may be characterized as a combiner circuit 39 that the combines the $f_{in}$ signals and the calculated "I" and "Q" signals. The resultant frequency $f_{out}$ can be described by the following equation:

$$\cos(2\pi f_{out} t) = \cos(2\pi f_{in} t)\cos(2\pi(f_{out}/N)t) + \sin(2\pi f_{in} t)\sin(2\pi(f_{out}/N)t)$$

When the divide by N circuit 36 is a divide by thirty-two (N=32) then the resultant frequency $f_{out}$ can be described by the following equation:

$$\cos(2\pi f_{out} t) = \cos(2\pi f_{in} t)\cos(2\pi(f_{out}/32)t) + \sin(2\pi f_{in} t)\sin(2\pi(f_{out}/32)t)$$

As is apparent from this result, the resultant output contains only the difference frequency signal and the sum frequency signal is eliminated.

Figure 4:
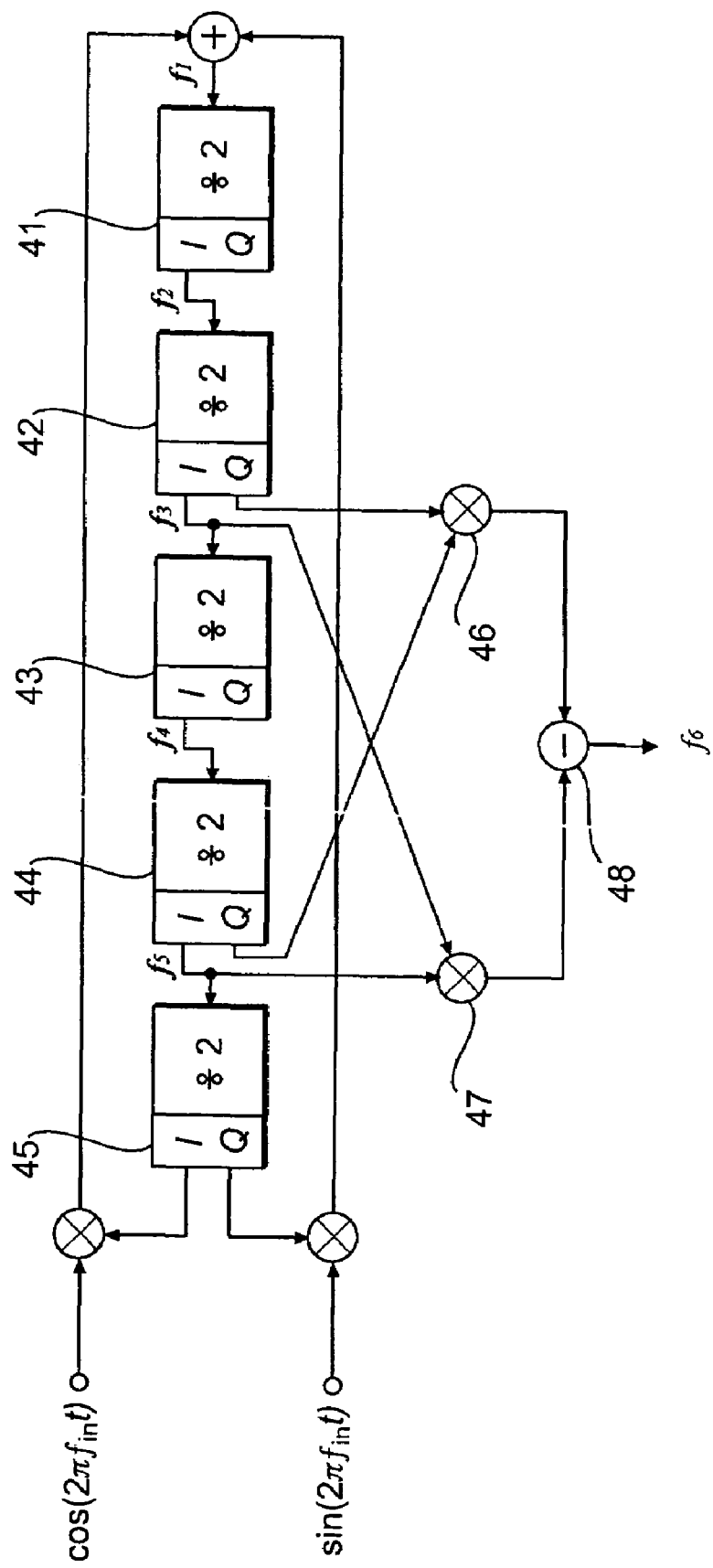
FIG. 4 shows an implementation of the FIG. 3 circuit in which a series of divide by two circuits are employed.

FIG. 4 shows an implementation of the FIG. 3 circuit in which the divide by 32 circuit created using 5 cascaded divide by 2 circuits. Each of the divide by 2 circuits 41, 42, 43, 44, and 45 will reduce the frequency by one-half. In particular, the first divide by 2 circuit 41 will divide a first frequency signal $f_1$ into a second frequency signal $f_2$, divide by 2 circuit 42 will divide the second frequency signal $f_2$ into a third frequency signal $f_3$, divide by 2 circuit 43 will take the third frequency signal $f_3$ from divide by 2 circuit 42 and make it the fourth frequency signal $f_4$. Subsequently, divide by 2 circuit 44 will take the output from divide by 2 circuit 43 of the fourth frequency signal $f_4$ and reduce it to a fifth frequency signal $f_5$. Of course any number of divide by N circuits may be used in the FIG. 4 implementation with N being any integer. Moreover, N can be different for each and every divide by circuit to allow for various combinations of signals. In this regard, $N_1$, $N_2$, $N_3$, ... $N_i$ do not each have to be equal to one another for a plurality of divide by $N_i$ circuits.

In an exemplary aspect of the system of FIG. 4, the first frequency $f_1$ may be 10 GHz, the second frequency $f_2$ may 5 GHz, the third frequency $f_3$ may be 2.5 GHz, the fourth frequency $f_4$ may 1.25 GHz, and the fifth frequency $f_5$ may be 625 MHz. However, it is contemplated that the invention can be used with different frequencies. Further, a fewer or a greater number of frequencies can be generated in accordance with the principles of the invention depending on the protocol or future enhancements thereof. In particular, the choice of input signals and the number of divide by 2 circuits will allow for a wide range of frequencies which is contemplated by the invention.

The FIG. 4 circuit, however, requires greater chip size and/or complexity to directly create any frequencies that are not one half of an input signal to one of the divide by 2 circuits 41–45 such as a 3.125 GHz signal from the above-noted exemplary aspect. This 3.125 GHz signal can be synthesized by quadrature mixing of the frequencies of 2.5 GHz and 625 MHz that are created by the divide by 2 circuit 42 and the divide by 2 circuit 44, respectively. This is achieved by taking the "I" output of divide by 2 circuit 42 and inputting it into a mixer 47 and taking the divide by 2 circuit 44 "I" output and also inputting it into mixer 47. Moreover, the "Q" output of the divide by 2 circuit 42 and the "Q" output of the divide by 2 circuit 44 are combined in mixer 46. The outputs of mixers 47 and 46 are then combined in a difference circuit 48 to result in the signal $f_6$=3.125 GHz. Specifically, difference circuit 48 calculates the difference between the output of mixer 46 and mixer 47 and outputs this difference as signal $f_6$. Accordingly, although a specific number of divide by 2 circuits is used, it should be apparent that any number of divide by 2 circuits can be used and any two of which may be used as noted above to provide a number of frequency possibilities. Thus, a wide-range of frequencies may be obtained through various combinations of the device by 2 circuits 41–45.

Figure 5:
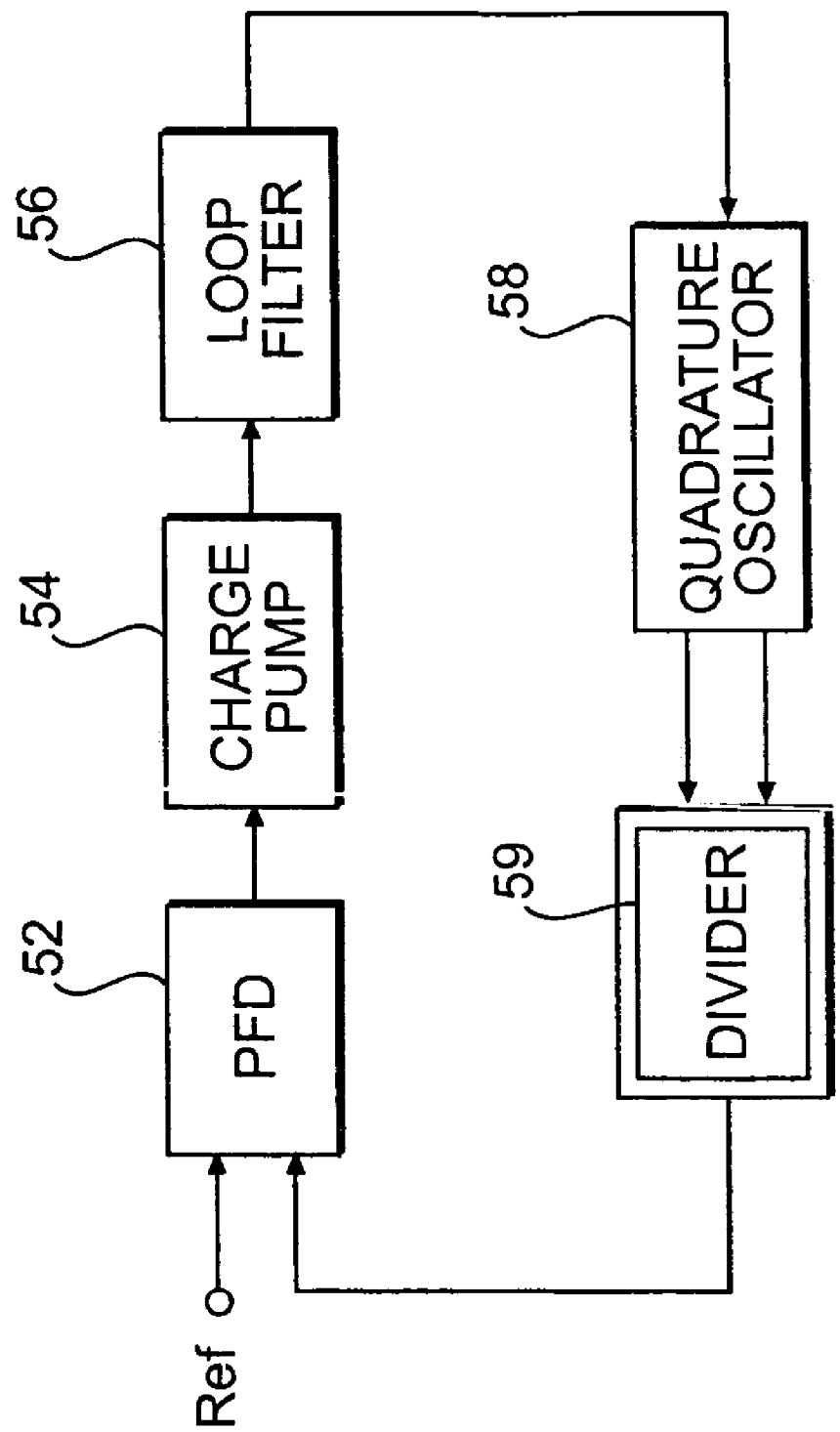
FIG. 5 shows a phase-locked loop device constructed according to the principles of the invention.

The circuit shown in FIG. 4 can be placed inside another circuit, such as a phase-lock loop device shown in FIG. 5. FIG. 5 shows an exemplary structure of a phase-lock loop device constructed according to the principles of the invention, including a phase frequency detector ("PFD") 52. The phase frequency detector 52 will detect a phase frequency based on at least one reference signal Ref. The output of the phase frequency detector 52 will then be input to a charge pump 54, which causes the charge pump 54 to charge a control voltage. The control voltage output of the charge pump 54 then will be input into loop filter 56, which will filter the signal from the charge pump 54. The filtered output from the loop filter 56 will then be input into an oscillator circuit 58. Next, the oscillator 58, which may be a quadrature oscillator, will create outputs that will be input into a divider 59, which can be of the type described in FIG. 4.

Although two outputs are shown for quadrature oscillator 58, any number of outputs may be used. Moreover, although a specific phase locked loop is shown any type of phase locked loop may be employed.

The device of FIG. 5 allows multiple frequencies on a single chip so that multiple coding schemes can be used. Moreover, in addition to being able to use multiple different encoding schemes the multiple frequencies may be based on a single clock source, such as a phase-locked loop, and not require multiple clock devices as in the prior art. This design may reduce costs and/or chip size.

Figure 6:
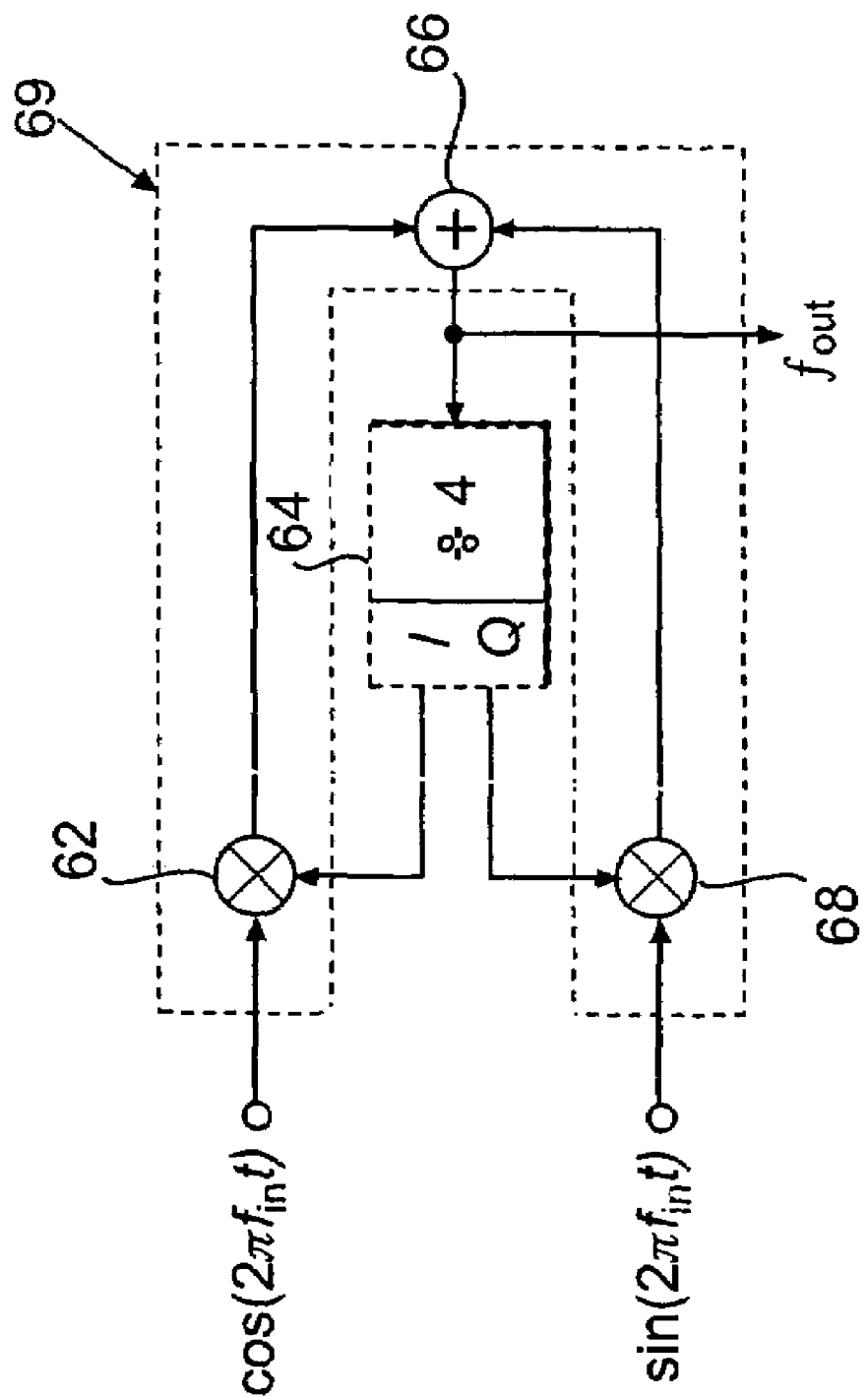
FIG. 6 shows a further implementation of a quadrature multiplier of the invention similar to FIG. 3.

FIG. 6 shows a further implementation of a quadrature multiplier such as shown in FIG. 3 that can be used to eliminate an unwanted sum frequency. In particular, the quadrature multiplier implementation shown in FIG. 6 includes two inputs of the $f_{in}$ signal. The two inputs may be produced from a quadrature oscillator, which is a known structure in the art for providing phase shifted clock signals. The first input from the quadrature oscillator directed to a mixer 62 is a $\cos(2\pi f_{in} t)$ signal. The second input from the quadrature oscillator directed to a second mixer 68 is a $\sin(2\pi f_{in})$ signal. The output of mixer 62 and mixer 68 are then summed by being input to a summer 66. The summer 66 will sum the signals and input this sum into the divide by N circuit 64. The divide by N circuit 64 will output "I" and "Q" outputs that will then be input into mixer 62 and mixer 68, respectively, together with the two $f_{in}$ signals noted above. The output of the summer 66 also will be tapped for the $f_{out}$ signal. The mixers 62, 68 and summer 66 may be characterized as a combiner circuit 69 that combines the $f_{in}$ signals and the calculated "I" and "Q" signals. When the divide by N circuit 64 is a divide by four circuit (N=4) then the resultant frequency $f_{out}$ can be described by the following equation:

$$\cos(2\pi f_{out} t) = \cos(2\pi f_{in} t)\cos(2\pi (f_{out}/4)t) + \sin(2\pi f_{in} t)\sin(2\pi (f_{out}/4)t)$$

As is apparent from this result, the resultant output contains only the difference frequency signal and the sum frequency signal is eliminated.

Such a system might be used, e.g. in the previously mentioned 8 B/10 B encoding scheme. In such an exemplary scheme, the two frequencies that may be required are 2.5 GHz and 3.125 GHz. Accordingly, as shown in FIG. 6, an input frequency of 3.125 GHz, is input into mixer 62 and mixer 68. In particular, the frequency input to mixer 62 is $\cos(2\pi f_{in} t)$ and the input to mixer 68 is $\sin(2\pi f_{in} t)$. The output of mixer 62 and 68 is then input to a summer 66. The sum, which is output from summer 66 is input into the divide by 4 circuit 64. The divide by 4 circuit 64 has two outputs, "I" and "Q". The "I" output of the divide by 4 circuit 64 will then be input to mixer 62. The "Q" output of the divide by 4 circuit 64 is input to mixer 68. The frequency $f_{out}$ will be tapped from the output of summer 66. The resulting output of $f_{out}$ will be ⅘ of the input frequency of 3.125 GHz that results in a frequency of 2.5 GHz. Accordingly, in this aspect of the invention, again multiple frequencies are created from a single clock source.

Figure 7:
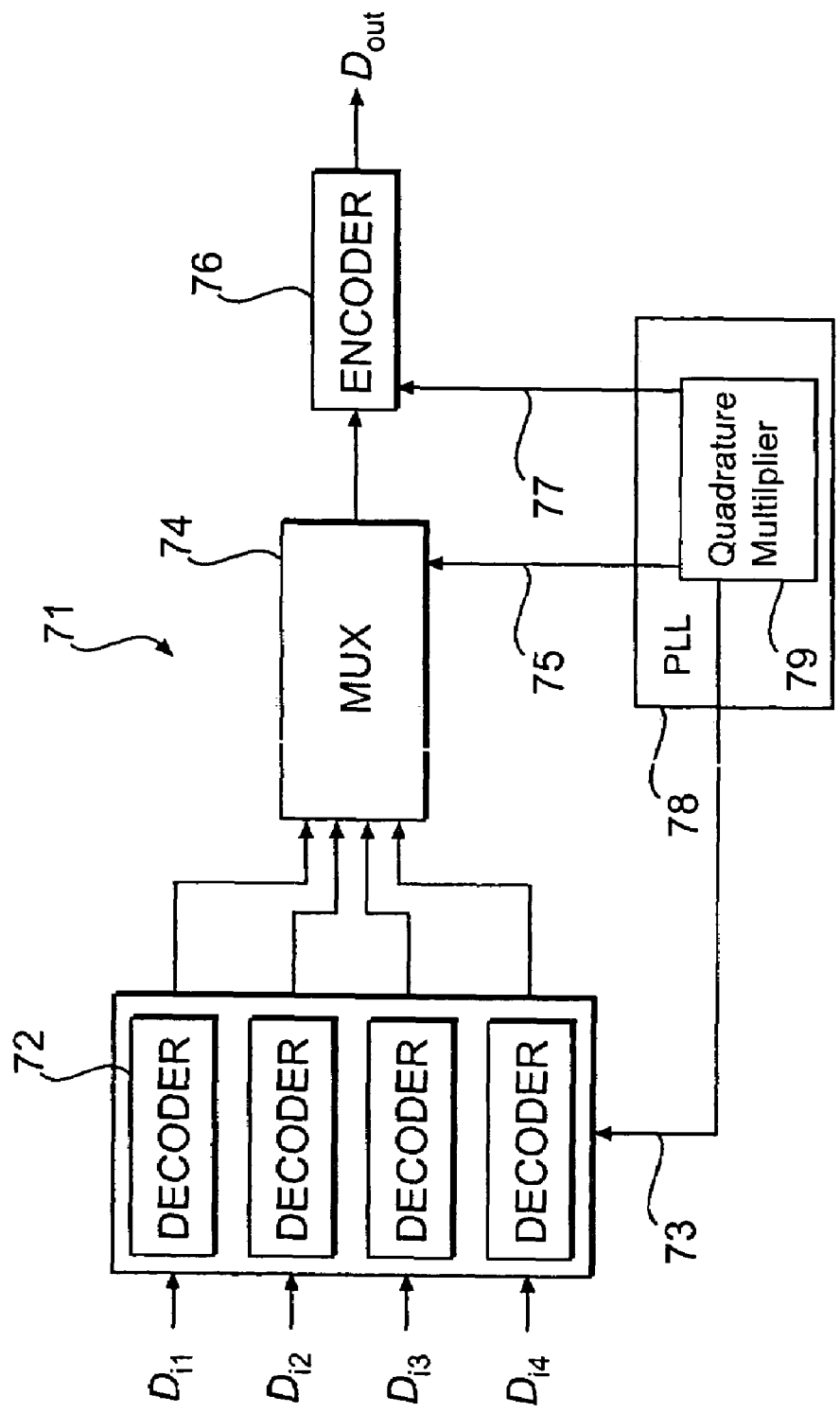
FIG. 7 shows a transmitter structure, phase-locked loop device, and quadrature multiplier constructed according to the principles of the invention.

FIG. 7 depicts a transmitter structure 71 that includes four input sequences $D_{i1}$, $D_{i2}$, $D_{i3}$, and $D_{i4}$. These input sequences are input into a decoder 72 (or a plurality of decoders) at a first frequency. The inputs $D_{i1}$, $D_{i2}$, $D_{i3}$, and $D_{i4}$ are decoded in the decoder 72 and the data is forwarded from the decoder 72 at a second frequency. Subsequently, the data that has been output from the decoder 72 is then merged in a multiplexer 74 into one stream operating at a third frequency. The data exiting the multiplexer 74 will then be encoded further by an encoder 76, such that the data $D_{out}$ is then transmitted at a fourth frequency. The transmitter structure 71 further includes a phase locked loop (PLL) device 78 (such as shown in FIG. 5) and a quadrature multiplier 79 (such as the divider 59 shown in FIG. 5). The quadrature multiplier 79 provides various operating frequencies through connections 73, 75, 77 as described above to each of the decoder 72, multiplexer 74, and encoder 76. The connections 73, 75, 77 may each include plural frequency signals as needed.

Figure 8:
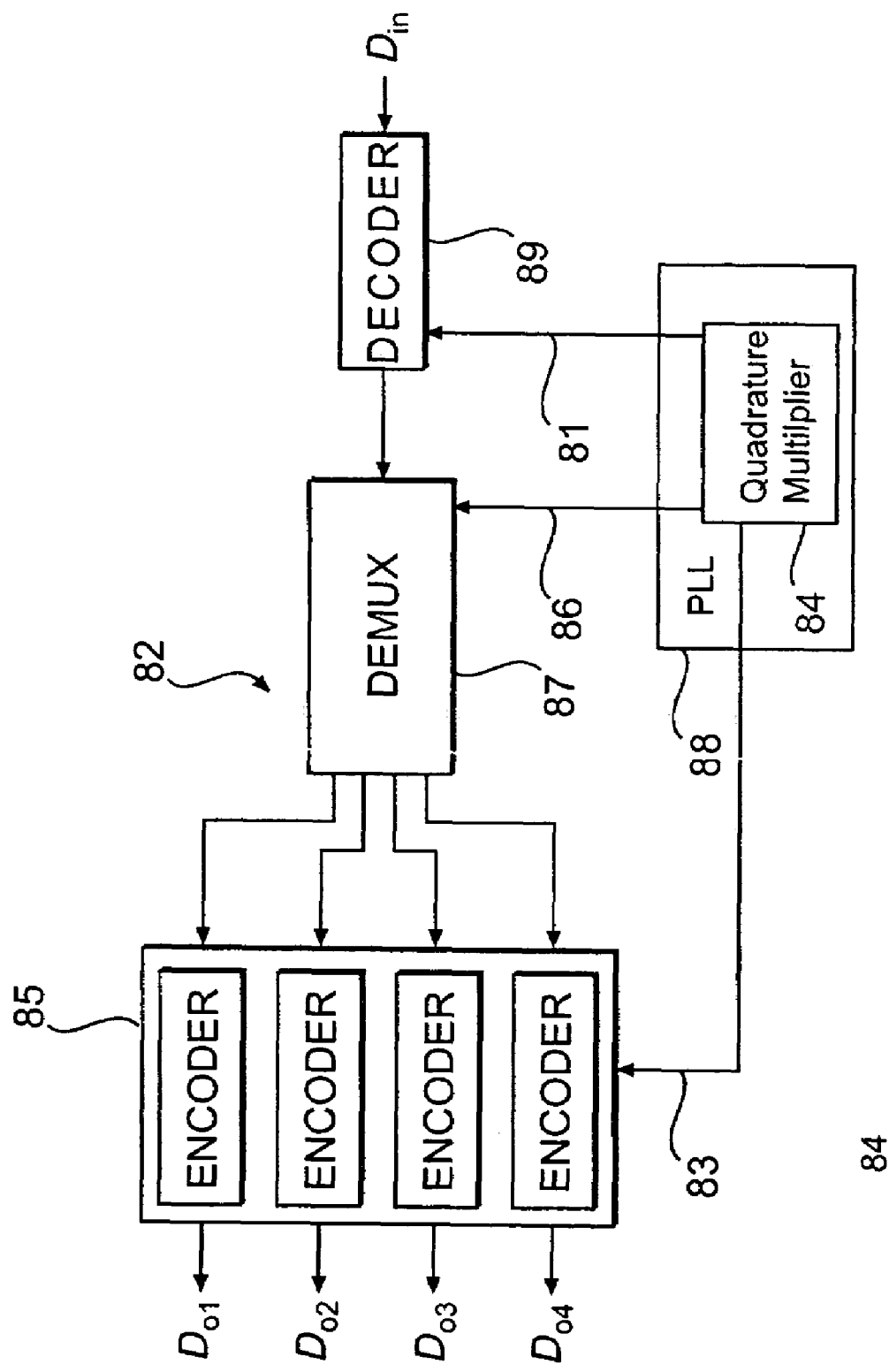
FIG. 8 shows a receiver structure, phase-locked loop device, and quadrature multiplier constructed according to the principles of the invention.

FIG. 8 further shows a receiver structure 82 that operates in reverse to the transmitter structure. The data stream $D_{in}$ is received by the system as a sequence at the fourth frequency. This data stream is then decoded in a decoder 89. The data stream output from the decoder 89 operates at the third frequency. This data stream is then forwarded to a demultiplexer 87. The output of the demultiplexer 87 creates four data paths, each operating at the second frequency. Each of these four data paths are then input into an encoder 85 (or plurality of encoders) where the data is encoded to form data path $D_{o1}$, $D_{o2}$, $D_{o3}$, and $D_{o4}$. Each of the four data paths $D_{o1}$, $D_{o2}$, $D_{o3}$, and $D_{o4}$ operate at the first frequency. The receiver structure 82 further includes a phase locked loop (PLL) device 88 (such as shown in FIG. 5) and a quadrature multiplier 84 (such as the divider 59 shown in FIG. 5). The quadrature multiplier 89 provides various operating frequencies through connections 83, 86, and 81 as described above to each of the decoder 89, multiplexer 87, and encoder 85. The connections 83, 86, and 81 may each include plural frequency signals as needed.

Although specific reference is made to using a quadrature controlled oscillator 58 in the various embodiments of the invention, any type of clock generation circuit may be used to provide a clock source having for example, at least two clock signals with a phase difference.

Although specific reference has been made to various frequencies, it should be clear that any oscillation frequency may be used with any divide by N circuit to provide a wide range of usable frequencies. Moreover, any number of divide by 2 circuits may be used.

Although the invention has been described in connection with a wireline transceiver, the invention may clearly be implemented in a receiver or a transmitter device. Moreover, those skilled in the art will also recognize that the invention has numerous applications including applications in Ethernet controllers, computer motherboards, modems, FSK modulation devices, FMD modulation, frequency synthesizers, tone decoding, frequency multiplication and division, SCA demodulators (hidden radio), telemetry receivers, signal regeneration, coherent demodulators, satellite, robotics, and radio.

Additionally, it is noted that the various components of the invention, such as the mixer, summer, divide by N circuit quadrature oscillator, are well known to those of ordinary skill in the art. One of ordinary skill would also be able to fabricate the components of the invention in one or more integrated circuits or application specific integrated circuits, if desired.

While the invention has been described in terms of exemplary embodiments, those skilled in the art will recognize that the invention can be practiced with modifications in the spirit and scope of the appended claims. These examples given above are merely illustrative and are not meant to be an exhaustive list of all possible designs, embodiments, applications or modifications of the invention.

What is claimed is:

1. A circuit comprising:
    an input that receives at least two input oscillation frequency signals, each having a different phase;
    a combiner circuit to synthesize a clock signal for input to a phase locked loop, said combiner circuit combining the input oscillation frequency signals and at least one calculated signal and outputting a first output oscillation frequency signal having a different frequency than each of the at least two input oscillation frequency signals, said first output signal comprising the clock signal; and
    a calculator circuit, responsive to the first output oscillation frequency signal, that outputs the at least one calculated signal.

2. The circuit according to claim 1, further comprising:
    a clock generator to output the at least two input oscillation frequency signals to said input.

3. The circuit according to claim 2 wherein said clock generator comprises a quadrature oscillator.

4. The circuit according to claim 1 wherein said combiner circuit comprises:
    at least two mixers responsive to at least one of the at least two input oscillation frequency signals and the at least one calculated signal.

5. The circuit according to claim 4 wherein said combiner circuit further comprises:
    a summer that receives an output from each of said at least two mixers and that outputs the first output oscillation frequency to said calculator circuit.

6. The circuit according to claim 1 wherein said calculator circuit comprises a divide by N circuit.

7. The circuit according to claim 6 wherein the at least one calculated signal comprises two output signals that are output from said divide by N circuit and are respectively received by at least two mixers, wherein N represents a positive integer.

8. The circuit according to claim 7 wherein the two output signals comprise a quadrature output and an in-phase output.

9. The circuit according to claim 8 wherein said divide by N circuit divides the first output oscillation frequency signal to form the two output signals.

10. The circuit according to claim 6 wherein said divide by N circuit comprises one of a divide by four (4) circuit and a divide by thirty-two (32) circuit.

11. The circuit according to claim 1 wherein the first output oscillation frequency is $f_{out}$, and the input oscillation frequency signals are $\cos(2\pi f_{in}t)$ and $\sin(2\pi f_{in}t)$ and $f_{in}$ and $f_{out}$ are described by $\cos(2\pi f_{out}t)=\cos(2\pi f_{in}t)\cos(2\pi(f_{out}/N)t)+\sin(2\pi f_{in}t)\sin(2\pi(f_{out}/N)t)$.

12. The circuit according to claim 11 wherein the at least two input oscillation frequency signals have a quadrature frequency of 3.125 GHz and the first output oscillation frequency signal has a frequency of 2.5 GHz.

13. The circuit according to claim 11 wherein the at least two input oscillation frequency signals have a quadrature frequency of 10.3125 GHz and the first output oscillation frequency signal has a frequency of 10 GHz.

14. The circuit according to claim 1 wherein said calculator circuit comprises:
    divide by $N_i$ circuits serially arranged, a final one of said divide by $N_i$ circuits having two outputs that are respectively received by at least two mixers and wherein an output of at least one of said divide by $N_i$ circuits comprises an intermediate output oscillation frequency signal.

15. The circuit according to claim 14 wherein said calculator circuit further comprises:
    a first additional mixer receiving outputs from at least two of said divide by $N_i$ circuits;
    a second additional mixer receiving outputs from at least two of said divide by $N_i$ circuits; and
    a subtractor that receives outputs from said first additional mixer and said second additional mixer and that outputs a second oscillation frequency.

16. The circuit according to claim 14 where N represents any positive integer.

17. The circuit according to claim 1 wherein:
    said combiner circuit comprises at least two mixers responsive to at least one of the at least two input oscillation frequency signals and the at least one calculated signal, and a summer, responsive to said at least two mixers, that outputs the first output oscillation frequency to said calculator circuit;
    the at least one calculated signal comprises a quadrature output and an in-phase output received by said at least two mixers; and
    said calculator circuit comprises a divide by N circuit, wherein N represents a positive integer, said divide by N circuit dividing the first output oscillation frequency signal to form the quadrature output and in-phase output.

18. A phase locked loop device including the circuit according to claim 1.

19. The phase locked loop circuit according to claim 18, further comprising:
    a phase frequency detector that receives at least one reference input;
    a charge pump that receives an output from said phase frequency detector;
    a loop filter that receives an output from said charge pump; and
    an oscillator that receives an output from said loop filter and said circuit receives an output from said oscillator.

20. One of an Ethernet controller, transceiver and a computer motherboard synthesizing frequencies with the circuit according to claim 1.

21. A method of generating multiple rates comprising:
    receiving at least two input oscillation frequency signals, each having a different phase;
    combining the at least two input oscillation frequency signals and at least one calculated signal to synthesize a clock signal for input to a phase locked loop and outputting a first output oscillation frequency signal having a different frequency than each of the at least two oscillation frequency signals, wherein the first output signal comprises the clock signal; and
    calculating the at least one calculated signal in response to the first output oscillation frequency signal.

22. The method of generating multiple rates according to claim 21 further comprising the step of:
    generating the at least two input oscillation frequency signals.

23. The method of generating multiple rates according to claim 21 wherein said combining step comprises:
    mixing each of the input oscillation frequency signals with the at least one calculated signal to create two mixed outputs.

24. The method of generating multiple rates according to claim 23 wherein said combining step further comprises:
    summing the mixed outputs together to output the first output oscillation frequency.

25. The method of generating multiple rates according to claim 21 wherein said calculating step further comprises:
dividing the first output oscillation frequency by N.

26. The method according to claim 25 wherein the at least one calculated signal comprises two output signals that are divided in said dividing step and mixed with the input oscillation frequency signals, wherein N in said dividing step represents a positive integer.

27. The method according to claim 26 wherein the two output signals comprise a quadrature output and an in-phase output.

28. The method according to claim 27 wherein said step of dividing divides the first output oscillation frequency signal to form the two output signals.

29. The method according to claim 21 wherein the first output oscillation frequency is $f_{out}$, and the input oscillation frequency signals are $\cos(2\pi f_{in}t)$ and $\sin(2\pi f_{in}t)$ and $f_{in}$ and $f_{out}$ are described by $\cos(2\pi f_{out}t)=\cos(2\pi f_{in}t)\cos(2\pi (f_{out}/N)t)+\sin(2\pi f_{in}t)\sin(2\pi (f_{out}/N)t)$.

30. The method according to claim 29 wherein the at least two input oscillation frequency signals have a quadrature frequency of 3.125 GHz and the first output oscillation frequency signal has a frequency of 2.5 GHz.

31. The method according to claim 29 wherein the at least two input oscillation frequency signals have a quadrature frequency of 10.3125 GHz and the first output oscillation frequency signal has a frequency of 10 GHz.

32. The method of generating multiple rates according to claim 21 further comprising:
repeatedly dividing the first input oscillation frequency by $N_i$ in serial fashion to form a plurality of divided signals, with each divided signal being reduced by further division until the final division occurs, the output of the final division comprising two outputs forming the at least one calculated signal.

33. The method of generating multiple rates according to claim 32 further comprising:
mixing two of the plurality of divided signals to form a first mixed signal;
mixing another two of the plurality of divided signals to form a second mixed signal; and
subtracting the first mixed signal and the second mixed signal to form a second output oscillation frequency signal.

34. The method of claim 32, wherein $N_i$ in said repeatedly dividing step is any positive integer.

35. The method of generating multiple rates according to claim 24 wherein:
said calculating step further comprises dividing the first output oscillation frequency by N;
the at least one calculated signal comprises two output signals that are divided in said dividing step and mixed with the input oscillation frequency signals, wherein N in said dividing step represents a positive integer and the two output signals comprise a quadrature output and an in-phase output.

36. One of an Ethernet controller, transceiver and a computer motherboard synthesizing frequencies according to the method of claim 21.

37. A circuit comprising:
means for inputting at least two input oscillation frequency signals, each having a different phase;
means for combining the input oscillation frequency signals and at least one calculated signal to synthesize a clock signal, and for outputting a first output oscillation frequency signal having a different frequency than each of the at least two input oscillation frequency signals as the clock signal for input to a phase locked loop; and
means for calculating, responsive to the first output oscillation frequency signal, the at least one calculated signal.

38. A circuit comprising:
an input that receives at least two input oscillation frequency signals, each having a different phase;
a combiner circuit that combines the input oscillation frequency signals and at least one calculated signal and outputs a first output oscillation frequency signal having a different frequency than each of the at least two input oscillation frequency signals; and
a calculator circuit, responsive to the first output oscillation frequency signal, that outputs the at least one calculated signal and comprises: divide by $N_i$ circuits serially arranged, a final one of said divide by $N_i$ circuits having two outputs that are respectively received by at least two mixers and wherein an output of at least one of said divide by $N_i$ circuits comprises an intermediate output oscillation frequency signal; a first additional mixer receiving outputs from at least two of said divide by $N_i$ circuits; a second additional mixer receiving outputs from at least two of said divide by $N_i$ circuits; and a subtractor that receives outputs from said first additional mixer and said second additional mixer and that outputs a second oscillation frequency.

39. A method of generating multiple rates comprising:
receiving at least two input oscillation frequency signals, each having a different phase;
combining the at least two input oscillation frequency signals and at least one calculated signal and outputting a first output oscillation frequency signal having a different frequency than each of the at least two oscillation frequency signals; and
calculating the at least one calculated signal in response to the first output oscillation frequency signal by mixing two of the plurality of divided signals to form a first mixed signal; mixing another two of the plurality of divided signals to form a second mixed signal; repeatedly dividing the first input oscillation frequency by $N_i$ in serial fashion to form a plurality of divided signals, with each divided signal being reduced by further division until the final division occurs, the output of the final division comprising two outputs forming the at least one calculated signal; and subtracting the first mixed signal and the second mixed signal to form a second output oscillation frequency signal.

* * * * *